US011509210B1

(12) United States Patent
Sun et al.

(10) Patent No.: US 11,509,210 B1
(45) Date of Patent: Nov. 22, 2022

(54) FREQUENCY SYNCHRONIZATION FOR A VOLTAGE CONVERTER

(71) Applicant: TEXAS INSTRUMENTS INCORPORATED, Dallas, TX (US)

(72) Inventors: Yueming Sun, Shanghai (CN); Guofeng Jin, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/347,177

(22) Filed: Jun. 14, 2021

(51) Int. Cl.
*H02M 1/08* (2006.01)
*H02M 3/155* (2006.01)
*H03K 3/037* (2006.01)
*H03K 4/48* (2006.01)
*H03K 5/24* (2006.01)

(52) U.S. Cl.
CPC .............. *H02M 1/08* (2013.01); *H03K 3/037* (2013.01); *H03K 4/48* (2013.01); *H03K 5/24* (2013.01); *H02M 3/155* (2013.01)

(58) Field of Classification Search
CPC ........ H02M 1/08; H02M 3/155; H03K 3/037; H03K 4/48; H03K 5/24
USPC ....................................................... 327/155
See application file for complete search history.

(56) References Cited

U.S. PATENT DOCUMENTS

| 4,536,700 | A | * | 8/1985 | Bello | .................... | H02M 3/156 |
| | | | | | | 323/288 |
| 6,058,030 | A | * | 5/2000 | Hawkes | ................. | H02J 1/102 |
| | | | | | | 363/71 |
| 6,181,120 | B1 | * | 1/2001 | Hawkes | ................. | H02M 3/156 |
| | | | | | | 323/285 |
| RE38,780 | E | * | 8/2005 | Hawkes | ................. | H02M 3/156 |
| | | | | | | 323/285 |
| 7,777,464 | B2 | * | 8/2010 | Jung | ..................... | H02M 3/156 |
| | | | | | | 323/275 |
| 2012/0038331 | A1 | * | 2/2012 | Wu | ...................... | H02M 3/1588 |
| | | | | | | 323/235 |
| 2014/0340059 | A1 | * | 11/2014 | Chen | ..................... | H02M 3/156 |
| | | | | | | 323/271 |

(Continued)

FOREIGN PATENT DOCUMENTS

EP      2164158 A2    3/2010

OTHER PUBLICATIONS

PCT Search Report for counterpart application PCT/US2022/033177, dated Sep. 27, 2022.

*Primary Examiner* — William Hernandez
(74) *Attorney, Agent, or Firm* — Michael A. Davis, Jr.; Charles A. Brill; Frank D. Cimino

(57) ABSTRACT

A device includes a comparator having a first comparator input configured to receive a time signal. The device also includes a subtractor having a subtractor output coupled to a second comparator input, and a first subtractor input adapted to be coupled to a voltage converter terminal. The device also includes a current source having an output coupled to a second subtractor input, and a current source input coupled to the first subtractor input. The device also includes a capacitor coupled to the second subtractor input and to ground. The device also includes a latch having an output and first and second inputs. The latch output is coupled to a control terminal of a transistor in parallel with the capacitor, the first latch input is coupled to the comparator output, and the second latch input is configured to receive a clock signal.

20 Claims, 7 Drawing Sheets

(56) References Cited

U.S. PATENT DOCUMENTS

2015/0077083 A1* 3/2015 Chen .................. H02M 3/156
  323/288
2019/0393783 A1 12/2019 Luo

* cited by examiner

FREQUENCY SYNCHRONIZATION FOR A VOLTAGE CONVERTER

BACKGROUND

Voltage converters convert an input voltage into an output voltage that may be different than the input voltage. Boost converters provide step-up conversion in which the output voltage is greater than the input voltage. Buck converters provide step-down conversion in which the output voltage is less than the input voltage. In both buck and boost converter topologies, an inductor is coupled to a power switch (e.g., a field-effect transistor (FET)). The power FET is turned ON and OFF to store energy in the inductor or transfer energy stored in the inductor to a load coupled to the voltage converter. Adaptive on/off time current control schemes for voltage converters control the switching of the power FET responsive to a comparison between a current through the inductor to a threshold (e.g., a current peak or current valley threshold) and to an indication of the on or off time of the power FET.

SUMMARY

In an example of the description, a device includes a comparator having a comparator output and first and second comparator inputs. The first comparator input is configured to receive a time signal. The device also includes a subtractor having a subtractor output and first and second subtractor inputs. The subtractor output is coupled to the second comparator input, and the first subtractor input is adapted to be coupled to a voltage terminal of a voltage converter. The device also includes a voltage-controlled current source having a current source output and a current source input. The current source output is coupled to the second subtractor input, and the current source input is coupled to the first subtractor input. The device also includes a capacitor coupled to the second subtractor input and to a ground terminal. The device also includes a latch having a latch output and first and second latch inputs. The latch output is coupled to a control terminal of a transistor in parallel with the capacitor, the first latch input is coupled to the comparator output, and the second latch input is configured to receive a clock signal.

In another example of the description, a device includes a sawtooth waveform circuit configured to provide a sawtooth signal responsive to a clock signal and responsive to a control signal for a power field-effect transistor (FET) of a voltage converter. A ramp of the sawtooth signal begins responsive to the clock signal and ends responsive to the control signal for the power FET. The device also includes a timing circuit coupled to the sawtooth waveform circuit. The timing circuit is configured to compare a time signal for the power FET to the sawtooth signal and provide a time comparison signal responsive to the comparison of the time signal to the sawtooth signal. The control signal for the power FET is provided responsive to the time comparison signal.

In yet another example of the description, a system includes a first voltage converter having a power field-effect transistor (FET) and a control circuit coupled to the voltage converter. The control circuit includes a sawtooth waveform circuit configured to provide a sawtooth signal responsive to a terminal signal from a terminal of a second voltage converter, and responsive to a control signal for the power FET. A ramp of the sawtooth signal begins responsive to the terminal signal and ends responsive to the control signal for the power FET. The control circuit also includes a timing circuit coupled to the sawtooth waveform circuit. The timing circuit is configured to compare a time signal for the power FET to the sawtooth signal and provide a time comparison signal responsive to the comparison of the time signal to the sawtooth signal. The control signal for the power FET is provided responsive to the time comparison signal.

DETAILED DESCRIPTION

Some applications use multiple voltage converters to provide multiple supply voltages for various subsystems. In some applications, multiple voltage converters are arranged as a synchronized multiphase voltage converter to provide an increased output current. In some cases, it is useful to synchronize the switching frequencies of multiple voltage converters. For example, a phase lock loop (PLL) is used to synchronize the switching frequencies of multiple voltage converters. However, a PLL is not effective for adaptive on/off time current control schemes, which lack an internal clock circuit that can be controlled by the PLL.

To address that problem, examples described below include a control circuit for a voltage converter. The control circuit uses an external signal (e.g., a clock signal from a clock generator or a signal from another voltage converter) to provide a synchronized sawtooth signal. The control circuit is configured to synchronize a switching frequency of the voltage converter to a frequency of the external signal responsive to a comparison of the sawtooth signal to a time signal that indicates the off time (or on time) of a power FET of the voltage converter. In some examples, components are used to provide a ramp of the sawtooth signal (e.g., capacitor(s) and/or current sources). In these examples, values of these components are selected to adjust a slope of the ramp to control a phase shift between the external signal and the synchronized switching frequency of the voltage converter controlled by the control circuit.

As described below, examples of this description can apply to a control circuit using a synchronized adaptive off time peak current (TOFF) control scheme for a boost converter, a control circuit using a synchronized adaptive on time valley current (TON) control scheme for a boost converter, a control circuit using a synchronized TOFF control scheme for a buck converter, or a control circuit using a synchronized TON control scheme for a buck converter.

Figure 1:
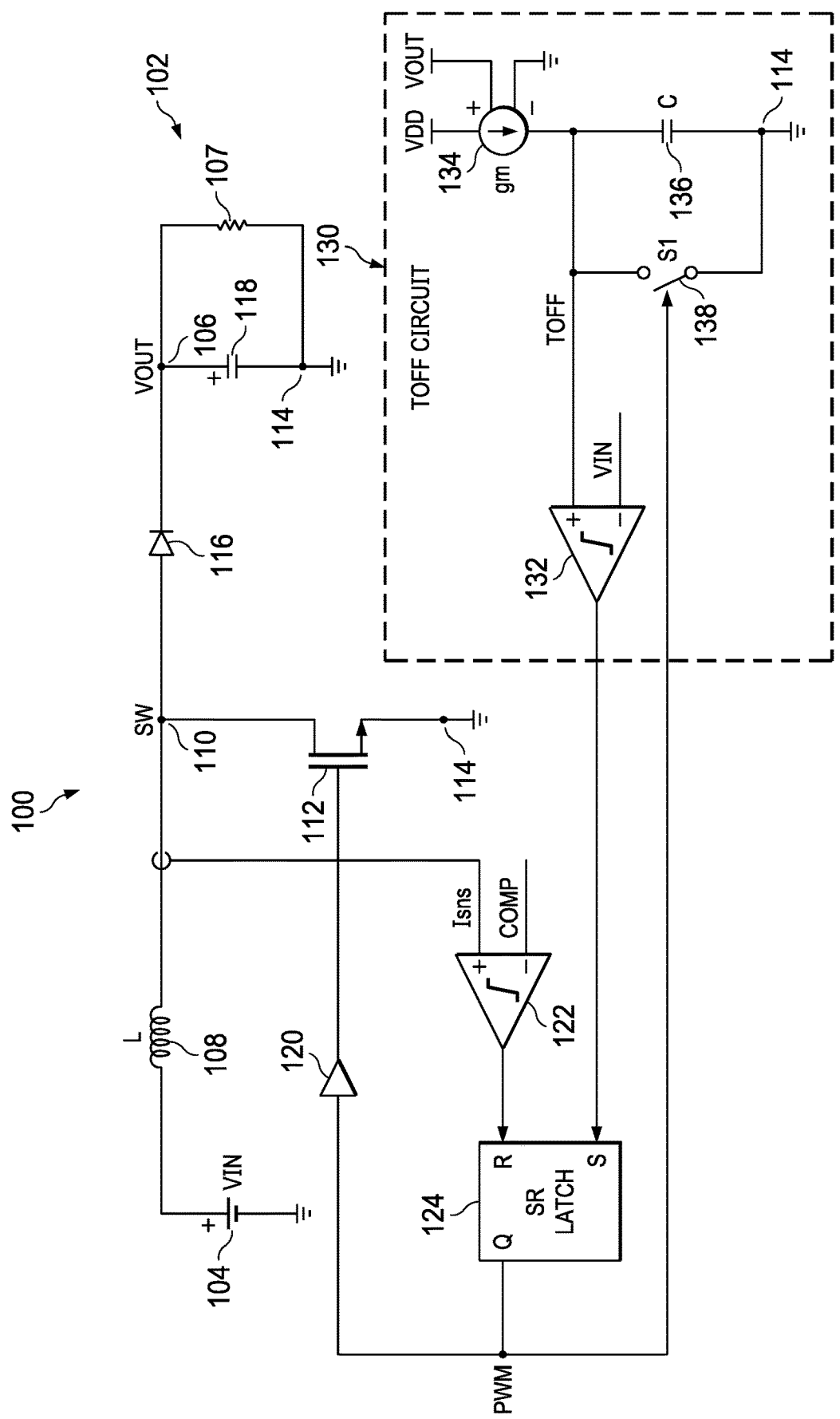
FIG. 1 is a schematic diagram of a system including a boost voltage converter in various examples.

FIG. 1 is a schematic diagram of a system 100 including a boost converter in examples of this description. The system 100 includes a voltage converter 102 configured as a boost converter, which converts an input voltage (VIN, provided by voltage source 104) to an output voltage (VOUT) that is provided to an output terminal 106. The output terminal 106 is adapted to be coupled to a load, which is represented by resistor 107. The boost converter 102 includes an inductor 108 coupled to the voltage source 104 and to a switching terminal 110 (the voltage at which is labeled SW). The boost converter 102 also includes a transistor 112 (e.g., a power FET 112) that is coupled to the switching terminal 110 and to a ground terminal 114. A diode 116 is coupled to the switching terminal 110 and to the output terminal 106. The diode 116 is configured to allow current to flow from the switching terminal 110 to output terminal 106, and thus to a load 107 responsive to a connection to the output terminal 106. An output capacitor 118 is coupled to the output terminal 106 and to the ground terminal 114.

The power FET 112 is controlled by a gate driver 120. The gate driver 120 receives a control signal (e.g., a pulse-width modulation (PWM) signal) and provides a voltage to a gate of the power FET 112 responsive to the control signal. For example, responsive to receiving a logic high control signal, the gate driver 120 provides a voltage to the gate of the power FET 112 sufficient to turn on the power FET 112. Continuing this example, responsive to receiving a logic low control signal, the gate driver 120 provides a voltage to the gate of the power FET 112 sufficient to turn off the power FET 112.

In the example of FIG. 1, the boost converter 102 is controlled using an adaptive off time peak current (TOFF) control scheme. The TOFF control scheme is implemented using a first comparator 122 that is configured to compare a current through the inductor 108 to a peak current threshold. The first comparator 122 has a non-inverting input that is configured to receive a sense voltage (Isns) that indicates (e.g., is proportional to) the current flowing through the inductor 108 (e.g., flowing through the encircled terminal between the inductor 108 and the switching terminal 110), and an inverting input that is configured to receive a threshold voltage (COMP) that is proportional to the peak current threshold. The first comparator 122 output is configured to provide a current threshold signal that is logic high responsive to the current through the inductor 108 being greater than the peak current threshold and that is logic low responsive to the current through the inductor 108 being less than the peak current threshold. The current threshold signal is provided as an input to a latch 124, the function of which is described below.

In the example of FIG. 1, a timing circuit 130 is a timer that is controlled by the input voltage (VIN) and the output voltage (VOUT) of the voltage converter 102. The timing circuit 130 includes a second comparator 132 that is configured to compare a time signal that is responsive to the off time of the power FET 112 of the voltage converter 102 to the input voltage (VIN). The second comparator 132 has an inverting input that is configured to receive the input voltage (VIN). The second comparator 132 also has a non-inverting input. An output of the second comparator 132 is a time comparison signal that is provided as an input to the latch 124.

In this example, the latch 124 is a set-reset (SR) latch, and the output of the second comparator 132 is provided to the S input of the SR latch 124. The current threshold signal described above is provided to the R input of the SR latch 124. The SR latch 124 output is the control signal (e.g., PWM signal) provided to the input of gate driver 120. Thus, the SR latch 124 output is set to logic high responsive to the output of the second comparator 132 being logic high, and the SR latch 124 output is reset to logic low responsive to the output of the first comparator 122 being logic high.

The timing circuit 130 includes a voltage-controlled current source 134 that has an output that is coupled to the second comparator 132 non-inverting input. The voltage-controlled current source 134 has a control input that is configured to receive VOUT. The voltage-controlled current source 134 is configured to provide a current equal to a gain (gm)*VOUT.

The timing circuit 130 also includes a capacitor 136 that is coupled to the second comparator 132 non-inverting input and to the ground terminal 114, and a transistor 138 in parallel with the capacitor 136. The transistor 138 is controlled responsive to the input to the gate driver 120. For example, the transistor 138 is off responsive to the power FET 112 being off and the transistor 138 is on responsive to the power FET 112 being on.

Responsive to the power FET 112 being on, the transistor 138 is on and the capacitor 136 is discharged. As a result, the second comparator 132 non-inverting input is less than VIN and the output of the second comparator 132 is logic low. However, responsive to the power FET 112 being off, the transistor 138 is off and the capacitor 136 is charged by the voltage-controlled current source 134. Responsive to a voltage across the capacitor 136 being greater than VIN, the output of the second comparator 132 is logic high.

In this example, the current through the inductor 108 increases responsive to the power FET 112 being on. Responsive to the current through the inductor 108 being greater than the peak threshold, the output of the first comparator 122 is logic high, which resets the output of the SR latch 124 to logic low, which turns off the power FET 112. The current through the inductor 108 decreases responsive to the power FET 112 being off.

Continuing this example, responsive to the power FET 112 being turned off, the transistor 138 also turns off and the capacitor 136 is charged by the voltage-controlled current source 134 (e.g., at a rate of (gm*VOUT)/C)). Responsive to the voltage across the capacitor 136 being greater than VIN, the output of the second comparator 132 is logic high, which sets the output of the SR latch 124 to logic high, which turns on the power FET 112. The off time of the power FET 112 is thus a function of the rate at which the capacitor 136 is charged ((gm*VOUT)/C) and VIN, while the switching frequency of the voltage converter 102 is a function of the off time of the power FET 112 as well as the slew rate of inductor 108 current. However, the switching frequency of the voltage converter 102 is not able to be synchronized to an external signal, or to the operation of another voltage converter.

Figure 2:
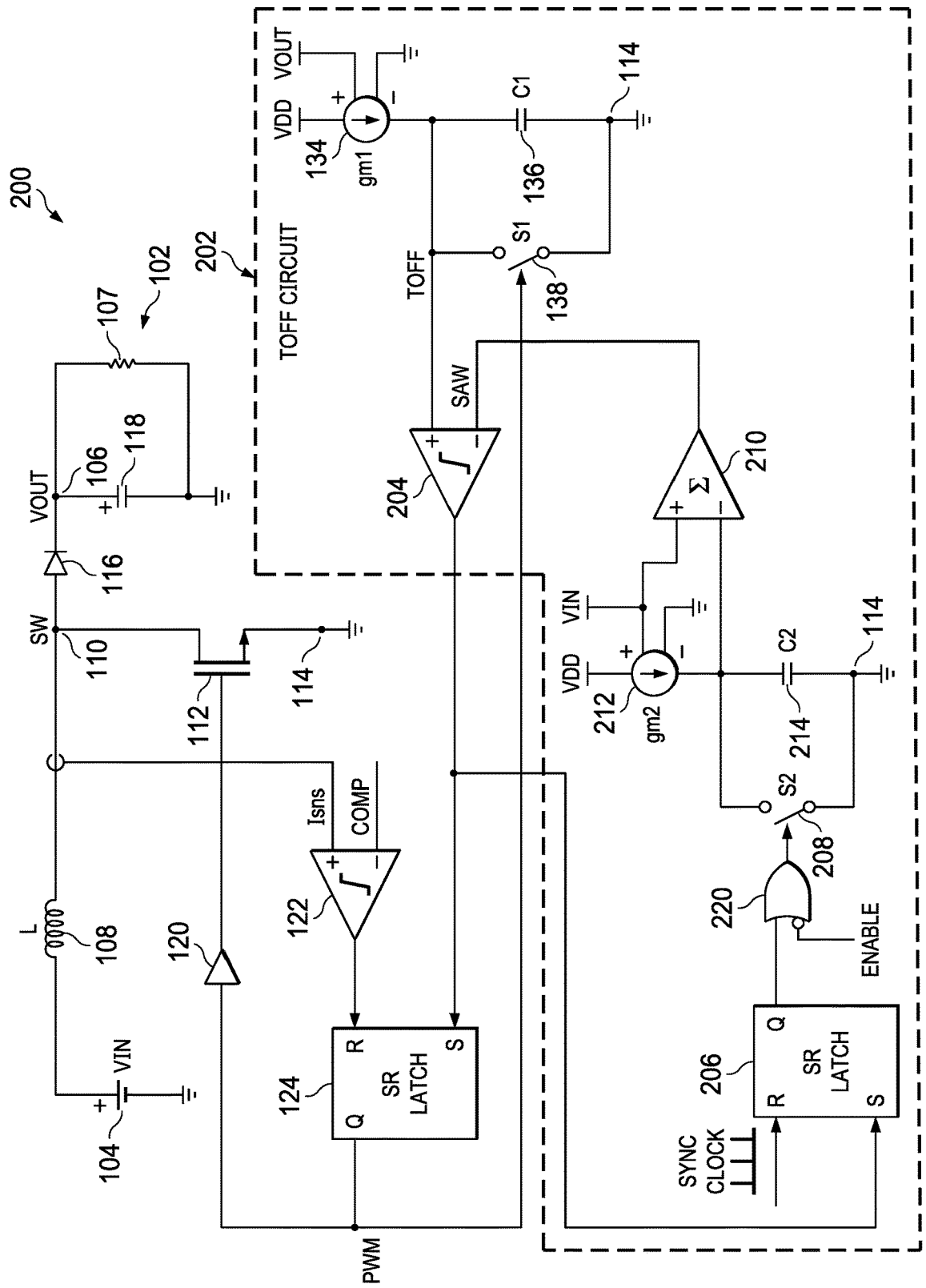
FIG. 2 is a schematic diagram of a system including a boost converter with synchronized adaptive off time peak current control in various examples.

FIG. 2 is a schematic diagram of a system 200 including the voltage converter 102 of FIG. 1. In FIG. 2, the system 200 includes a control circuit 202 that implements synchronized TOFF control in various examples. The control circuit 202 includes a comparator 204 that functions similarly to the second comparator 132, described above. The comparator 204 has a non-inverting input that is configured to receive a time signal that is responsive to the off time of the power FET 112 of the voltage converter 102 (e.g., in which the time signal is provided by the voltage-controlled current source 134 (having a gain gm1), the capacitor 136 (C1), and the transistor 138 (S1) as described above). The comparator 204 also has an inverting input that is configured to receive a sawtooth signal, described below. As above, an output of the comparator 204 is provided to the S input of the SR latch 124. The comparator 204, voltage-controlled current source 134, capacitor 136, and transistor 138 are referred to as a timing circuit at times.

The remainder of the control circuit 202 is configured to provide a sawtooth signal (SAW) and provide the sawtooth signal to the inverting input of the comparator 204. The remainder of the control circuit 202 is referred to as a sawtooth waveform circuit at times. For example, the control circuit 202 includes a latch 206, which is an SR latch 206 in FIG. 2. The SR latch 206 has an S input that is coupled to the output of the comparator 204 and an R input that is configured to receive a clock signal. In one example, the clock signal is provided by a clock generator circuit. In another example, the "clock signal" is provided by a terminal of another voltage converter and is referred to at times as a "terminal signal" to differentiate from a clock generator-provided clock signal. Irrespective of the source of the clock signal, an output of the SR latch 206 is coupled to a control terminal (e.g., a gate) of a transistor 208.

The control circuit 202 also includes a subtractor 210 that has a non-inverting input adapted to be coupled to a voltage terminal of the voltage converter 102. In the example of FIG. 2, the non-inverting input of the subtractor 210 is configured to receive VIN. The subtractor 210 also has an inverting input and provides an output that is a voltage difference between the non-inverting input and the inverting input. The subtractor 210 output is coupled to the inverting input of the comparator 204 and is the sawtooth signal (SAW), as described below.

The control circuit 202 also includes a voltage-controlled current source 212 that has an output that is coupled to the subtractor 210 inverting input. The voltage-controlled current source 212 has a control input that is configured to receive VIN. The voltage-controlled current source 212 is configured to provide a current equal to a gain (gm2)*VIN.

The control circuit 202 also includes a capacitor 214 (C2) that is coupled to the subtractor 210 inverting input and to the ground terminal 114. The transistor 208 is in parallel with the capacitor 214. The transistor 208 is controlled responsive to the output of the SR latch 206. For example, the transistor 208 is off responsive to the SR latch 206 output being logic low and the transistor 208 is on responsive to the SR latch 206 output being logic high.

In the example of FIG. 2, at the end of the off time of the power FET 112, the output of the comparator 204 is logic high, which turns on the power FET 112 and also sets the output of the SR latch 206 to logic high. Responsive to the output of the SR latch 206 being logic high, the transistor 208 is on and the capacitor 214 is discharged. As a result, the inverting input of the subtractor 210 is pulled to the ground terminal 114 (e.g., 0V) and the output of the subtractor 210 is VIN.

However, responsive to an edge (e.g., a rising edge) of the clock signal, the output of the SR latch 206 is reset to logic low. Responsive to the output of the SR latch 206 being logic low, the transistor 208 is off and the capacitor 214 is charged by the voltage-controlled current source 212. The increasing voltage across the capacitor 214 is subtracted from VIN with the difference being provided as the subtractor 210 output. Thus, in this example, a ramp of the sawtooth signal begins responsive to the rising edge of the clock signal.

Responsive to the power FET 112 being turned off, the non-inverting input of the comparator 204 (e.g., the voltage across the capacitor 136) increases while the sawtooth signal output of the subtractor 210 decreases. Responsive to the voltage across the capacitor 136 being greater than the voltage of the sawtooth signal, the output of the comparator 204 is logic high, which again sets the output of the SR latch 206 to logic high, and the described process repeats. As a result, the control circuit 202 implements synchronized TOFF control such that the switching frequency of the voltage controller 102 is synchronized to the clock signal input to the SR latch 206.

In the example of FIG. 2, an optional enable circuit includes an OR gate 220 having a first input coupled to the output of the SR latch 206 and a second input coupled to an inverted enable signal. An output of the OR gate 220 is provided to control the transistor 208. In this example, responsive to the enable signal being logic high, the output of the SR latch 206 is passed through the OR gate 220 to control the transistor 208 as described above. Responsive to the enable signal being logic low, the output of the OR gate 220 is always logic high and thus the transistor 208 is on. Responsive to the transistor 208 being on, the capacitor 214 is discharged and the output of the subtractor 210 is VIN, and the control circuit 202 behaves as the timing circuit 130 described in FIG. 1.

Figure 3:
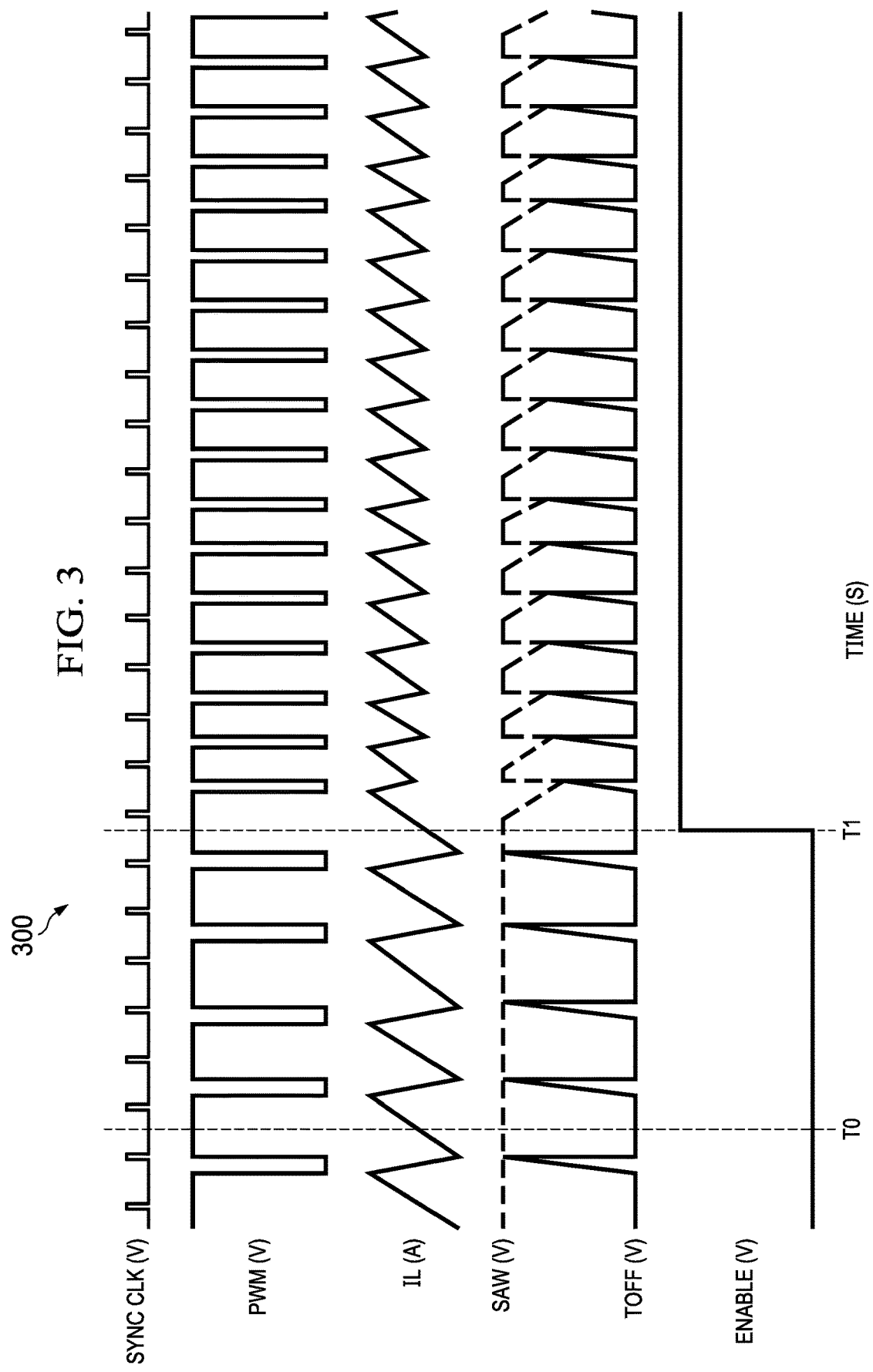
FIG. 3 is a graph of waveforms demonstrating operation of the system of FIG. 2.

FIG. 3 is a graph of waveforms 300 demonstrating operation of the system 200 of FIG. 2. In the waveforms 300, SYNC CLK represents a voltage provided to the R input of the SR latch 206, PWM represents a voltage provided by the output of the SR latch 124, IL represents a current through the inductor 108, SAW represents a voltage provided by the output of the subtractor 210, TOFF represents a voltage provided to the non-inverting input of the second comparator 204, and ENABLE represents a voltage provided as the enable signal to the OR gate 220, described above.

At time T0, ENABLE is logic low, and thus the output of the subtractor 210 is VIN, and the control circuit 202 behaves as the timing circuit 130 described in FIG. 1. For example, responsive to IL reaching a current threshold, the PWM signal is reset (e.g., due to the output of the first comparator 122 resetting the SR latch 124 output) and IL decreases while the power FET 112 is off. Also, while the power FET 112 is off, the switch 138 opens and the capacitor 136 (e.g., TOFF) is charged by the voltage-controlled current source 134. Responsive to TOFF reaching SAW, which is VIN before time T1, the output of the second comparator 204 transitions to logic high, which sets the PWM signal and again turns on the power FET 112.

At time T1, ENABLE is set to logic high, and thus the output of the SR latch 206 controls the transistor 208. As described above, responsive to a rising edge of SYNC CLK, the output of the SR latch 206 is reset to logic low, which turns off the transistor 208. Responsive to the transistor 208 being off, the capacitor 214 is charged by the voltage-controlled current source 212. The increasing voltage across the capacitor 214 is subtracted from VIN with the difference being provided as the subtractor 210 output (SAW). Thus, after time T1, a ramp of the sawtooth signal begins responsive to the rising edge of the clock signal.

As above, while the power FET 112 is off, the switch 138 opens and the capacitor 136 (e.g., TOFF) is charged by the voltage-controlled current source 134. Responsive to TOFF reaching SAW, the output of the second comparator 204 transitions to logic high, which sets the PWM signal and again turns on the power FET 112. The output of the second comparator 204 transitioning to logic high also sets the output of the SR latch 206 and discharges the capacitor 214, which causes SAW to return to VIN. This above process continues while ENABLE is logic high, with the switching frequency of the power FET 112 now synchronized to the SYNC CLK signal.

Figure 4:
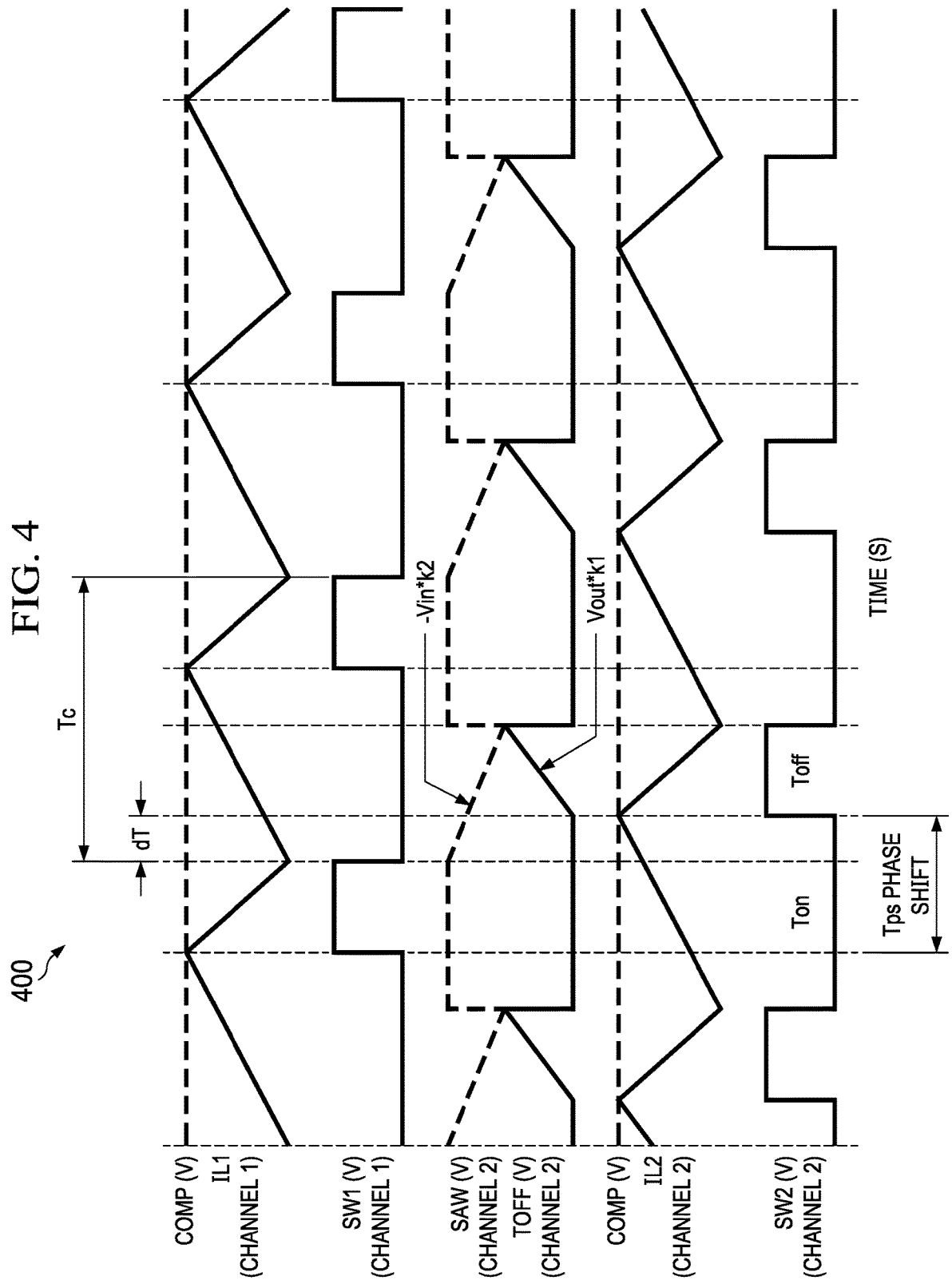
FIG. 4 is a graph of waveforms demonstrating synchronization of a voltage converter with adaptive on/off time current control with a terminal of another voltage converter in various examples.

FIG. 4 is a graph of waveforms 400 demonstrating synchronization of a voltage converter with adaptive on/off time current control with a terminal of another voltage converter in various examples. In the waveforms 400, "Channel 1" indicates signals for a first voltage converter while "Channel 2" indicates signals for a second voltage converter. In this example, the first voltage converter operates as described above with respect to FIG. 1, and does not necessarily synchronize its operation to an external clock signal. As described below, the second voltage converter (Channel 2) synchronizes its operation, as in FIG. 2, to that of the first voltage converter (Channel 1). Further, the Channel 2 switching frequency is phase shifted relative to the Channel 1 switching frequency through selection of the values of gm1, C1, gm2, and/or C2 in the control circuit 202 described above.

In the waveforms 400, COMP represents a voltage provided to the inverting input of the first comparator 122 and IL1 is a sense voltage that indicates (e.g., is proportional to) the current flowing through the inductor 108 for the Channel 1 voltage converter. SW1 represents a voltage at the switching terminal 110 of the Channel 1 voltage converter.

SAW represents a voltage provided by the output of the subtractor 210 of the control circuit 202 for the Channel 2 voltage converter, TOFF represents a voltage provided to the non-inverting input of the second comparator 204 for the Channel 2 voltage converter, IL2 is a sense voltage (that is also compared to COMP as above) that indicates the current flowing through the inductor 108 for the Channel 2 voltage converter, and SW2 represents a voltage at the switching terminal 110 of the Channel 2 voltage converter.

In the example of FIG. 4, SW (inverted) from the Channel 1 voltage converter is provided to the R input of the SR latch 206 of the control circuit 202 for the Channel 2 voltage converter. As a result, a falling edge of SW1 resets the SR latch 206 for the Channel 2 voltage converter, which begins a ramp of SAW for the Channel 2 voltage converter as described above.

In the waveforms 400, Tc represents the time period between falling edges of SW1 (e.g., the "clock signal" for the control circuit 202 for the Channel 2 voltage converter). Tps represents a phase shift between the switching frequencies of the Channel 1 and Channel 2 voltage converters. dT represents an amount of time between the falling edge of SW1 and the rising edge of SW2, which also is the falling edge of the PWM output of the SR latch 124 for the Channel 2 voltage converter. In this example, the slew rate of the SAW ramp is $-((gm2*VIN)/C2)$ (e.g., the rate at which the capacitor 214 is charged and the slew rate of the TOFF ramp is $((gm1*VOUT)/C1)$ (e.g., the rate at which the capacitor 136 is charged). In the following description, $k1=gm1/C1$ and $k2=gm2/C2$.

In this example, the SAW waveform for the Channel 2 voltage converter is synchronized to the falling edge of SW1 from the Channel 1 voltage converter, as described above. Also as described above, for the Channel 2 voltage converter, the switching cycles are triggered responsive to the output of the comparator 204, which is logic high responsive to TOFF and SAW being approximately equal (e.g., TOFF being just greater than SAW causes the comparator 204 output to transition to logic high). This relation can be expressed by Equation 1:

$$V_{IN} - k_2 \times V_{IN} \times (T_{oFF}(n) - dT(n)) = k_1 \times V_{OUT} \times T_{OFF}(n) \quad (1)$$

Where $T_{OFF}(n)$ is the off time in a cycle n, and $dT(n)$ is a time delta between the sync clock provided to the R input of the SR latch 206 (e.g., SW1 falling edge in the example of FIG. 4) and the leading edge of SW2, which occurs responsive to IL2 reaching COMP (e.g., the current through the inductor 108 being greater than the peak current threshold). Solving Equation 1 for $T_{OFF}(n)$ gives Equation 2:

$$T_{OFF}(n) = \frac{V_{IN} + k_2 \times V_{IN} \times dT(n)}{k_1 \times V_{OUT} + k_2 \times V_{IN}} \quad (2)$$

The voltage-second balance on the inductor 108 of the Channel 2 voltage converter, which determines the on time Ton, results in the switching period of the Channel 2 voltage converter (Ts) being given by Equation 3:

$$T_S(n) = \frac{V_{OUT}}{V_{IN}} \times T_{OFF}(n) = \frac{V_{OUT}}{V_{IN}} \times \frac{V_{IN} + k_2 \times V_{IN} \times dT(n)}{k_1 \times V_{OUT} + k_2 \times V_N} \quad (3)$$

The dT in a subsequent cycle (e.g., $dT(n+1)$) can be derived as in Equation 4:

$$dT(n+1) = \quad (4)$$
$$dT(n) + T_C - T_S(n) = dT(n) + T_C - \frac{V_{OUT}}{V_{IN}} \times \frac{V_{IN} + k_2 \times V_{IN} \times dT(n)}{k_1 \times V_{OUT} + k_2 \times V_{IN}}$$

Equation 4 can be simplified, as in Equation 5:

$$\frac{dT(n+1) - dT(n)}{dT(n) - dT(n-1)} = 1 - \frac{1}{\left(\frac{k_1}{k_2} + \frac{V_{IN}}{V_{OUT}}\right)} \quad (5)$$

In certain examples, $dT(n)$ is convergent to a constant value dT as the Channel 2 converter switches over a number of cycles provided that $$\left(\frac{k_1}{k_2} + \frac{V_{IN}}{V_{OUT}}\right) \geq 0.5.$$

The value dT is given by Equation 6:

$$dT = \lim_{n \to \infty} dT(n) = \frac{k_1}{k_2} \times T_C - \frac{1}{k_2} + \frac{V_{IN}}{V_{OUT}} \times T_C \quad (6)$$

The phase shift between the Channel 1 and Channel 2 switching frequencies (e.g., Tps) is given by Equation 7:

$$T_{PS} = T_{OFF} - dT \quad (7)$$

In Equation 7, TOFF is the off time of the converter in steady status, and so Toff is given by Equation 8:

$$T_{OFF} = \frac{V_{IN}}{V_{OUT}} \times T_c \quad (8)$$

Equation 7 is thus rewritten (e.g., to include Equation 8) as Equation 9:

$$T_{PS} = \frac{V_{IN}}{V_{OUT}} \times T_c - dT = \frac{1}{k_2} - \frac{k_1}{k_2} T_C \qquad (9)$$

In some examples, k1 and k2 are selected to be equal values, so Tps is simplified to Tc−1/k2. Thus, by selecting different values of k2, the phase shift between the switching frequency of the Channel 2 voltage converter and the "clock signal" (e.g., the switching terminal 110 of the Channel 1 voltage converter in this example) also can be adjusted. The following Table 1 demonstrates the relationship between various values of k2 and the corresponding phase shift.

TABLE 1

Relationship between k2 and phase shift.

| k2 | Tps | Phase shift |
|---|---|---|
| k2 = 4/5 * (1/Tc) | 1/4 Tc | 90 degree |
| k2 = 3/4 * (1/Tc) | 1/3 Tc | 120 degree |
| k2 = 2/3 * (1/Tc) | 1/2 Tc | 180 degree |

Figure 5:
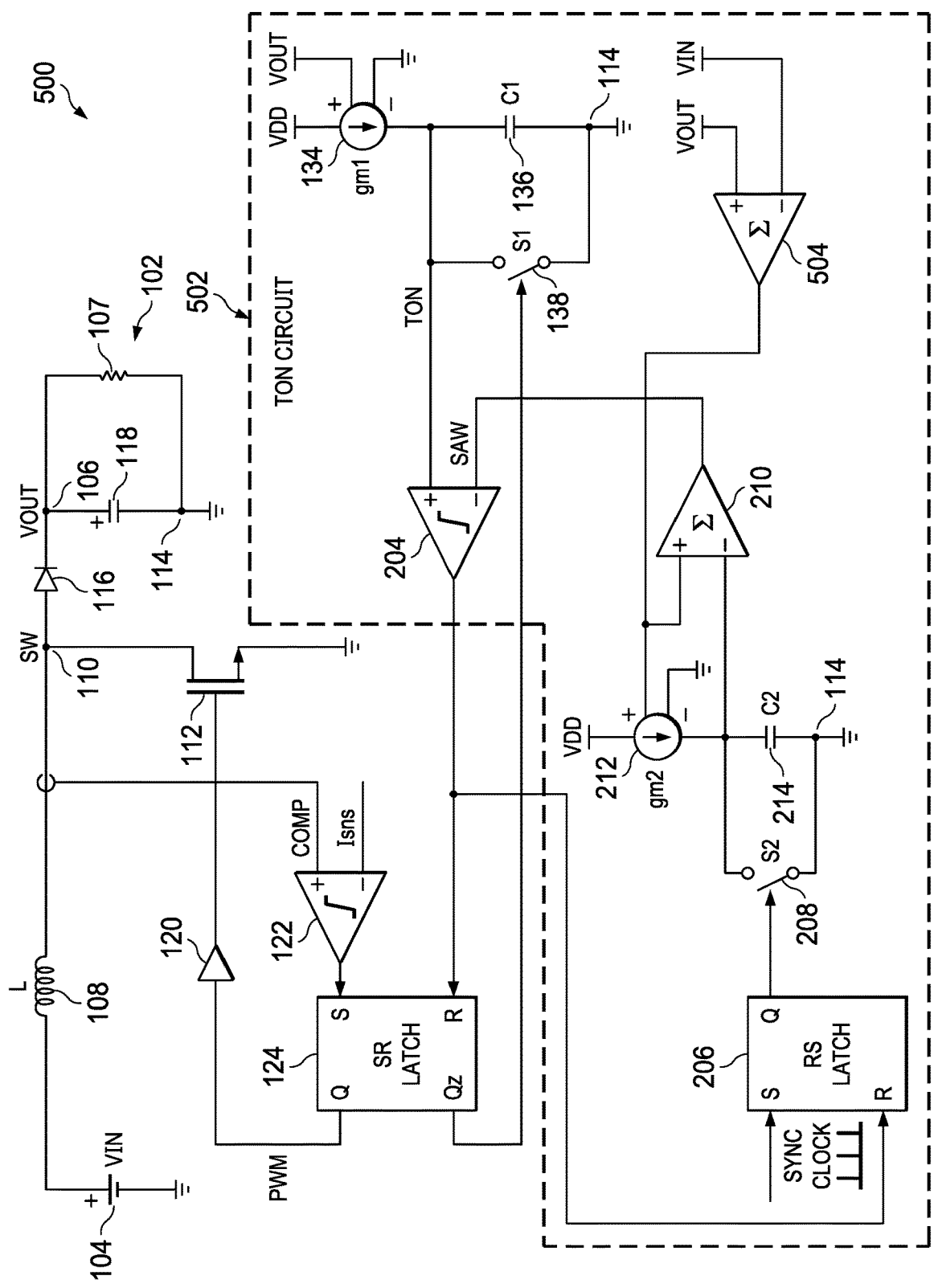
FIG. 5 is a schematic diagram of a system including a boost converter with synchronized adaptive on time valley current control in various examples.

FIG. 5 is a schematic diagram of a system 500 including a boost converter 102 with synchronized adaptive on time valley current control in various examples. The system 500 includes a boost converter 102 as generally described above. In FIG. 5, the first comparator 122 inputs are switched to detect a current valley rather than a current peak, as in FIGS. 1 and 2. For example, in FIG. 5, the first comparator 122 inverting input is configured to receive the sense voltage (Isns) and the first comparator 122 non-inverting input is configured to receive the threshold voltage (COMP) that is proportional to the valley current threshold. Thus, in FIG. 5, the first comparator 122 output is configured to provide a current threshold signal that is logic high responsive to the current through the inductor 108 being less than the valley current threshold and that is logic low responsive to the current through the inductor 108 being greater than the peak current threshold.

The system 500 includes a control circuit 502 that is also similar to the control circuit 202 described above, with the following differences. The transistor 138 is off responsive to the power FET 112 being on and the transistor 138 is on responsive to the power FET 112 being off. Thus, responsive to the power FET 112 being off, the capacitor 136 is discharged; responsive to the power FET 112 being on, the capacitor 136 is charged and thus provides a TON signal to the comparator 204. Also, the control circuit 502 includes a second subtractor 504 that provides VOUT−VIN as its output. The output of the subtractor 504 is provided to the non-inverting input of the subtractor 210 and thus serves as the base voltage level for the SAW signal at the output of the subtractor 210. VOUT−VIN also serves as the control input for the voltage-controlled current source 212. The remainder of the control circuit 502 functions substantially as described above with respect to the control circuit 202 in FIG. 2.

Figure 6:
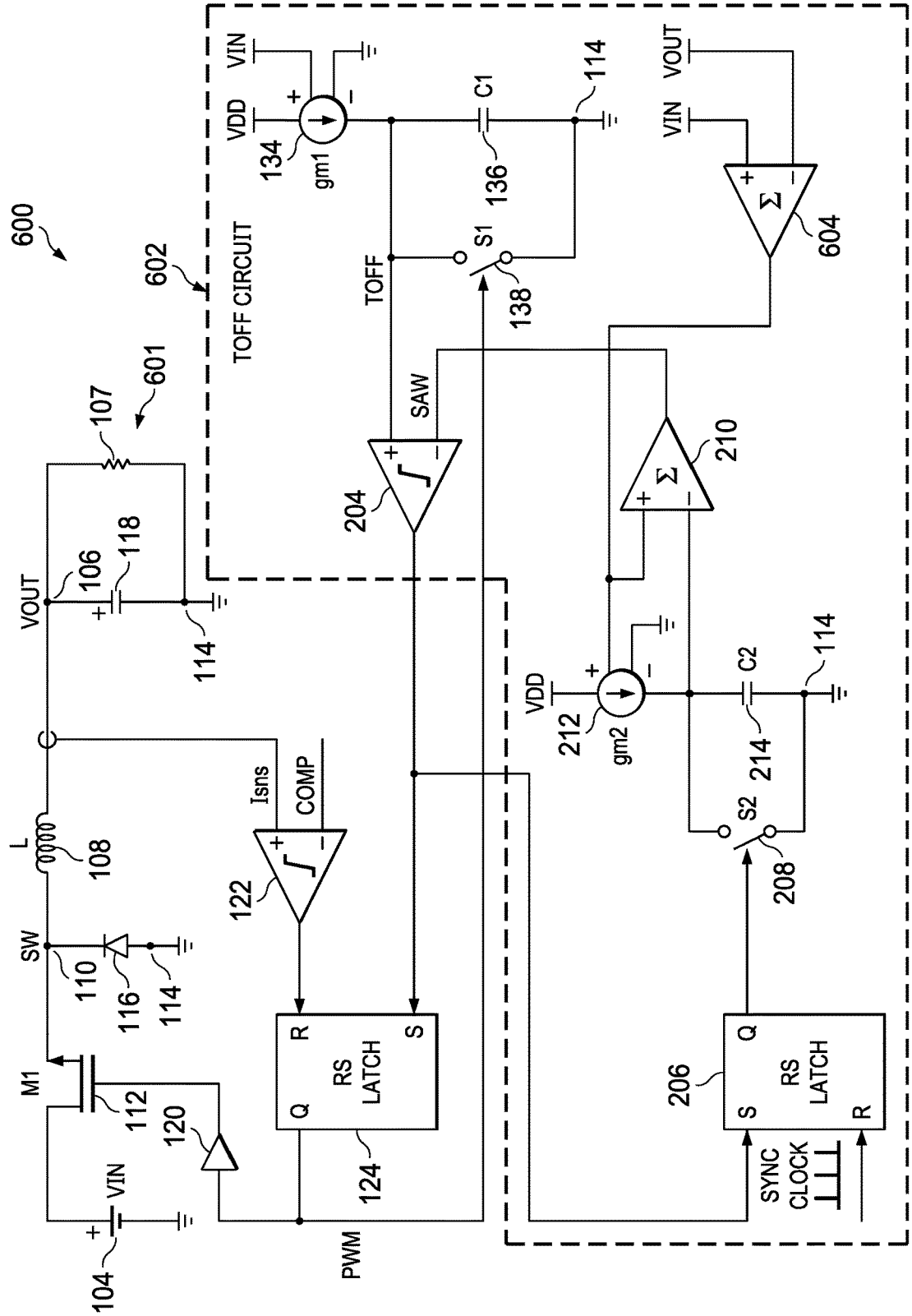
FIG. 6 is a schematic diagram of a system including a buck converter with synchronized adaptive off time peak current control in various examples.

FIG. 6 is a schematic diagram of a system 600 including a buck converter 601 with synchronized adaptive off time peak current control in various examples. The buck converter 601 contains similar components as the boost converter 102, described above, with slight variations in their arrangement. For example, the power FET 112 is adapted to be coupled to the input voltage source 104 and to the switching terminal 110. The diode 116 is coupled to the switching terminal 110 and to the ground terminal 114. The inductor 108 is coupled to the switching terminal 110 and to the output terminal 106. In FIG. 6, the first comparator 122 inputs are similar to those shown in FIGS. 1 and 2 to detect a current peak. For example, in FIG. 6, the first comparator 122 non-inverting input is configured to receive the sense voltage (Isns) and the first comparator 122 inverting input is configured to receive the threshold voltage (COMP) that is proportional to the peak current threshold. Thus, in FIG. 6, the first comparator 122 output is configured to provide a current threshold signal that is logic high responsive to the current through the inductor 108 being greater than the peak current threshold and that is logic low responsive to the current through the inductor 108 being less than the peak current threshold.

The system 600 includes a control circuit 602 that is also similar to the control circuit 202 described above, with the following differences. The voltage-controlled current source 134 has a control input that is configured to receive VIN, rather than VOUT as in FIG. 2. In the control circuit 602, the voltage-controlled current source 134 is thus configured to provide a current equal to a gain (gm1)*VIN. Also, the control circuit 602 includes a second subtractor 604 that provides VIN−VOUT as its output. The output of the subtractor 604 is provided to the non-inverting input of the subtractor 210 and thus serves as the base voltage level for the SAW signal at the output of the subtractor 210. VIN−VOUT also serves as the control input for the voltage-controlled current source 212. The remainder of the control circuit 602 functions substantially as described above with respect to the control circuit 202 in FIG. 2.

Figure 7:
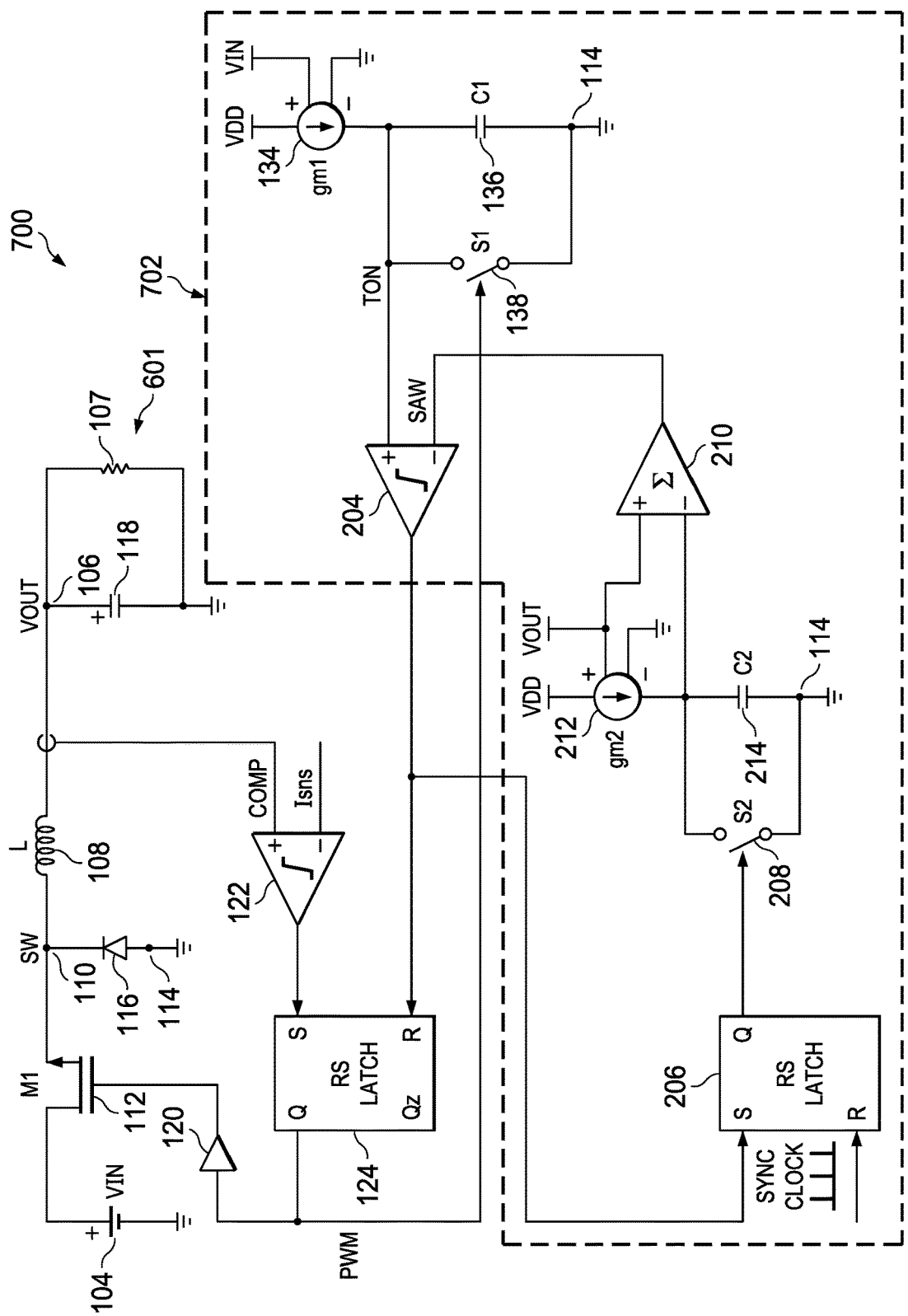
FIG. 7 is a schematic diagram of a system including a buck converter with synchronized adaptive on time valley current control in various examples.

FIG. 7 is a schematic diagram of a system 700 including the buck converter 601 with synchronized adaptive on time valley current control in various examples. The system 700 includes the buck converter 601 as generally described above. In FIG. 7, the first comparator 122 inputs are switched to detect a current valley rather than a current peak. For example, in FIG. 7, the first comparator 122 inverting input is configured to receive the sense voltage (Isns) and the first comparator 122 non-inverting input is configured to receive the threshold voltage (COMP) that is proportional to the valley current threshold. Thus, in FIG. 7, the first comparator 122 output is configured to provide a current threshold signal that is logic high responsive to the current through the inductor 108 being less than the valley current threshold and that is logic low responsive to the current through the inductor 108 being greater than the peak current threshold.

The system 700 includes a control circuit 702 that is also similar to the control circuit 202 described above, with the following differences. As in FIG. 6, the voltage-controlled current source 134 has a control input that is configured to receive VIN, rather than VOUT as in FIG. 2. The transistor 138 is off responsive to the power FET 112 being on and the transistor 138 is on responsive to the power FET 112 being off. Thus, responsive to the power FET 112 being off, the capacitor 136 is discharged; responsive to the power FET 112 being on, the capacitor 136 is charged and thus provides a TON signal to the comparator 204. Also, the subtractor 210 in control circuit 702 receives VOUT at its non-inverting input, and thus VOUT serves as the base voltage level for the SAW signal at the output of the subtractor 210. VOUT also serves as the control input for the voltage-controlled current source 212. The remainder of the control circuit 702 functions substantially as described above with respect to the control circuit 202 in FIG. 2.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground voltage potential" in this description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications are possible in the described examples, and other examples are possible, within the scope of the claims.

What is claimed is:

1. A device, comprising:
    a comparator having a comparator output and first and second comparator inputs, the comparator configured to receive a time signal at the first comparator input;
    a subtractor having a subtractor output and first and second subtractor inputs, in which the subtractor output is coupled to the second comparator input, and the first subtractor input is a voltage input terminal;
    a voltage-controlled current source having a current source output and a current source input, the current source output coupled to the second subtractor input, and the current source input coupled to the first subtractor input;
    a capacitor coupled to the second subtractor input and to a ground terminal;
    a latch having a latch output and first and second latch inputs, the latch output coupled to a control terminal of a transistor in parallel with the capacitor, the first latch input coupled to the comparator output, and the latch configured to receive a clock signal at the second latch input.

2. The device of claim 1, wherein the voltage input terminal is a first voltage input terminal, the voltage-controlled current source is a first voltage-controlled current source, the capacitor is a first capacitor, the transistor is a first transistor, and the device comprises:
    a second voltage-controlled current source having a second current source output and a second current source input, in which the second current source output is coupled to the first comparator input, and the second current source input is a second voltage input terminal;
    a second capacitor coupled to the first comparator input and to the ground terminal; and
    a second transistor in parallel with the second capacitor, the second transistor controlled responsive to the comparator output.

3. The device of claim 1, wherein the latch is an S-R latch, the first latch input is a set input, the second latch input is a reset input, and the latch output is a non-inverted output.

4. The device of claim 1, wherein the voltage input terminal is adapted to be coupled to an input terminal of a boost converter.

5. The device of claim 1, wherein a voltage at the voltage input terminal is a difference between a voltage at an output voltage terminal of a boost converter and a voltage at an input terminal of the boost converter.

6. The device of claim 1, wherein a voltage at the voltage input terminal is a difference between a voltage at an input voltage terminal of a buck converter and a voltage at an output terminal of the buck converter.

7. The device of claim 1, wherein the voltage input terminal is adapted to be coupled to an output terminal of a buck converter.

8. The device of claim 1, wherein the latch is a first latch, the latch output is a first latch output, the first latch input is a first latch first input, the second latch input is a first latch second input, and the device comprises:
    a second latch having a second latch output, a second latch first input, and a second latch second input, the second latch first input coupled to the comparator output, the second latch configured to: receive a current threshold signal at the second latch second input, in which the current threshold signal represents a comparison between an inductor current and a threshold current; and provide a field-effect transistor (FET) control signal at the second latch output.

9. A device, comprising:
    a sawtooth waveform circuit configured to provide a sawtooth signal responsive to a clock signal and responsive to a field-effect transistor (FET) control signal, in which a ramp of the sawtooth signal begins responsive to the clock signal and ends responsive to the FET control signal; and a timing circuit coupled to the sawtooth waveform circuit, the timing circuit configured to:

compare a FET time signal to the sawtooth signal; and provide a time comparison signal responsive to the comparison of the FET time signal to the sawtooth signal, in which the FET control signal is responsive to the time comparison signal.

10. The device of claim 9, wherein the ramp begins from a boost converter input voltage, and the FET time signal indicates a FET off time.

11. The device of claim 9, wherein the ramp begins from a boost converter output voltage minus a boost converter input voltage, and the FET time signal indicates a FET on time.

12. The device of claim 9, wherein the ramp begins from a buck converter input voltage minus a buck converter output voltage, and the FET time signal indicates a FET off time.

13. The device of claim 9, wherein the ramp begins from a buck converter output voltage, and the FET time signal indicates a FET on time.

14. The device of claim 9, wherein the clock signal is an externally generated clock signal.

15. A system, comprising:
a first voltage converter having a field-effect transistor (FET); and
a control circuit coupled to the first voltage converter, the control circuit including:
a sawtooth waveform circuit configured to provide a sawtooth signal responsive to a terminal signal from a second voltage converter and responsive to a FET control signal, in which a ramp of the sawtooth signal begins responsive to the terminal signal and ends responsive to the FET control signal; and
a timing circuit coupled to the sawtooth waveform circuit, the timing circuit configured to:

compare a FET time signal to the sawtooth signal; and provide a time comparison signal responsive to the comparison of the FET time signal to the sawtooth signal, in which the FET control signal is responsive to the time comparison signal.

16. The system of claim 15, wherein the terminal signal is an inverted signal of a switching terminal of the second voltage converter.

17. The system of claim 15, wherein the ramp begins from a boost converter input voltage, and the FET time signal indicates a FET off time.

18. The system of claim 15, wherein the ramp begins from a boost converter output voltage minus a boost converter input voltage, and the FET time signal indicates a FET on time.

19. The system of claim 15, wherein the ramp begins from a buck converter input voltage minus a buck converter output voltage, and the FET time signal indicates a FET off time.

20. The system of claim 15, wherein the ramp begins from a buck converter output voltage, and the FET time signal indicates a FET on time.

* * * * *